May 25, 1965 K. SIEBERTZ 3,184,831

METHOD OF PRODUCING AN ELECTRIC CONTACT
WITH A SEMICONDUCTOR DEVICE

Filed Nov. 7, 1961

3,184,831
Patented May 25, 1965

3,184,831

METHOD OF PRODUCING AN ELECTRIC CONTACT WITH A SEMICONDUCTOR DEVICE

Karl Siebertz, Munich-Obermenzing, Germany, assignor to Siemens & Halske Aktiengesellschaft, Berlin, Germany, a corporation of Germany Filed Nov. 7, 1961, Ser. No. 150,673
Claims priority, application Germany, Nov. 16, 1960, S 71,283
8 Claims. (Cl. 29—155.5)

My invention relates to rectifiers, transistors, and other electronic semiconductor devices, as well as to circuit devices on which more than one solid-state components are combined, and in a more particular aspect to a method for electrically connecting a conducting part with a given spot of such semiconductor device.

Due to the small geometric dimensions of the components employed in semiconductor techniques, there often arises the problem of electrically joining a spot of very small size with a terminal, conductor or other metal part having a large area in comparison with the spot being contacted on the semiconductor body.

It is an object of my invention to provide a contacting and joining method which solves this problem in a particularly simple and reliable manner.

According to the invention, I provide between the spot to be contacted at the semiconductor device, on the one hand, and the part to be connected thereto, on the other hand, a body of conducting and relatively soft material, such as gold, silver or copper, of approximately spherical shape, the use of gold being preferable; and I apply between the device and the part a pressure sufficient to cause plastic deformation of the body, thereby firmly connecting the part mechanically and electrically to the contacted location of the semiconductor device.

The method is applicable, for example, for contacting the electrodes of p-n junction diodes and transistors, particularly mesa transistors, also for producing or completing the wiring of circuits with solid-state components in which the active components (such as diodes and transistors) and passive components (such as conductors) of a circuit or network are anchored in a carrier body preferably consisting of semiconductor material.

When performing the method of the invention, the spherical or globular bodies, prior to being compressed and deformed, are preferably joined preliminarily with the connector part or with the spot to be contacted. This can be done, for example, by soldering, slight alloying or applying a relatively slight pressure to obtain an initial, slight deformation of the intermediate body. However, the method can also be performed by providing other means for holding the intermediate body in the desired position prior to the pressing operation.

The invention will be further described with reference to embodiments of devices illustrated by way of example on the accompanying drawing in which.

Figure 1:
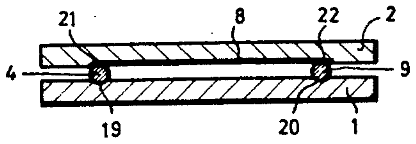
FIG. 1 shows schematically and in cross section two parts of a static-component circuit assembly prior to completing the circuit by joining the two parts together.

According to FIG. 1 a flat carrier body or plate 1 of semiconductor material, preferably silicon, contains active and passive solid-state components of a circuit or network to be completed by an externally added conductor. Denoted by 19 and 20 are two spots on the carrier plate 1 which, for this purpose, must be electrically connected with each other. In accordance with one way of performing the method of the invention, the plate 1, at the localities 19 and 20 to be contacted, is provided with respective grooves or cavities of approximately circular shape. This can be done mechanically or chemically, for example by etching. Thereafter, respective bodies 4 and 9 of plastically deformable and electrically good conducting material are placed into the respective cavities, the bodies having a diameter larger than that of the cavities. In the present embodiment the bodies 4, 9 are of globular shape and consist of gold.

Figure 2:
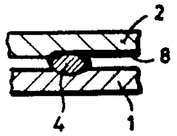
FIG. 2 shows a portion of the same assembly in completed condition.

A second plate 2 is provided with conductive metal strips or coatings to provide a path for completing the wiring of the network on the carrier plate 1. This is preferably done by imprinting the conducting paths upon the plate 2 in accordance with the conventional methods of producing printed circuits. One of these metal paths, consisting essentially of silver for example, is shown in FIG. 1 and denoted by 8. This particular path serves to interconnect the spots 19 and 20 of the solid-state component network on carrier plate 1. The plate 2 consists of a suitable insulating material such as synthetic plastic, ceramic or glass. The metal path extending between the localities 21 and 22 of the insulating cover plate 2 may be given any desired width and is likewise provided with cavities by mechanical or chemical means. The cavities of plate 2 are placed upon the free top surfaces of the respective globules 4 and 9. Thereafter, the plates 1 and 2 are pressed against each other at a sufficient pressure to plastically deform the globules as shown in FIG. 2 for globule 4. This causes a cold-welding to occur between the globule and the contacted locality of the carrier plate 1 as well as between the globule and the metal coating 8 on the cover plate 2. The contacted localities of the carrier plate 1 and hence of the network mounted or embedded in the material of the carrier plate are thus permanently connected mechanically and electrically with the metal path of cover plate 2.

While according to the embodiment described above, both parts to be joined together are provided with shallow cavities for holding the plastically deformable globules in the proper positions, such cavities may be omitted on one side of each junction.

Figure 3:
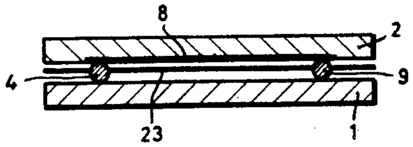
FIG. 3 illustrates schematically and in cross section a modified embodiment of an assembly generally similar to that of FIG. 1.

According to a modification of the invention, the cavities may be eliminated entirely by providing some other means for securing the globules in the desired positions prior to applying the deforming pressure. This can be effected, for example, by means of an intermediate mica foil 23 as shown in FIG. 3. The foil 23 is provided with perforations traversed by the respective balls or globules 4 and 9. The foils or strips may be given various shapes and sizes. After the junction between parts 1 and 2 is completed by pressing and deforming the spherical bodies 4 and 9, the foil or strip members may either remain part of the device or they may be subsequently removed.

The method according to the invention is also applicable to advantage in cases where the second part 2 also consists of a semiconductor body upon which the metal paths for completing the wiring are deposited, for example by vapor deposition, and which also contains active and passive circuit components. The method may also serve to use the above-described, substantially spherical bodies of plastically deformable and electrically good conducting metal for directly connecting electrodes or terminals of active or passive components appertaining to the solid-state circuit on plate 1 with electrodes or terminals of active or passive components appertaining to the solid-state circuit on plate 2.

Figure 4:
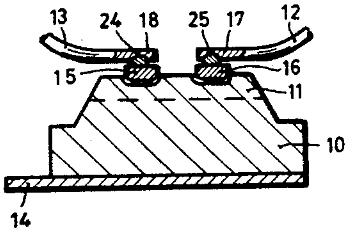
FIG. 4 is a sectional view of a mesa-type transistor made according to the invention.

The mesa transistor according to FIG. 4 comprises a semiconductor body 10 of silicon having the shape of a circular body. The bottom of the silicon body 10 is covered by a collector terminal 14. The top portion of the silicon body comprises a base layer 11 produced by diffusion. Alloyed into the base layer 11 is a base electrode 16 which forms an ohmic (barrier-free) contact with the base layer. Also alloyed into the base layer 11 is an emitter electrode 15 which is doped to form a p-n junction together with the base layer. The terminal conductors 12 and 13 to be attached to the base electrode 16 and emitter electrode 15 respectively are each provided with a cavity 25, 24. Spherical bodies are placed into the respective cavities. Prior to producing the junctions, these spherical bodies rest upon the two electrodes of the transistor. They are electrically and mechanically firmly joined with the electrodes 15 and 16 by applying sufficient pressure to deform the two bodies. The two bodies preferably consist of gold as in the preceding embodiments.

Due to the small size of the electrodes, particularly on mesa transistors, it is sometimes difficult to provide the terminal conductors with cavities. In this case it is preferable to employ the above-mentioned other means of holding the spherical connector bodies in position and to deform them between the flat electrode and conductor surfaces. One way of doing this is to preliminarily attach the spherical bodies to the respective conductors or electrodes, for example by soldering, alloying or slight deformation, and to then apply the joining and deforming pressure while the spherical bodies remain attached at the proper locations.

The intermediate bodies can be given the desired substantially spherical shape by any suitable method, depending upon the desired size. For example, a liquid metal, such as gold, can be dropped out of a nozzle to produce drop-shaped globules. The liquid material may also be comminuted or converted to dust constitution by spraying or squirting from a nozzle in "atomizer" fashion.

A particularly small diameter of the intermediate bodies can be obtained by applying a high electric voltage between the nozzle and an outer collector or receiving container for the globular bodies. The resulting electric field reduces the surface tension of the material being comminuted, thus reducing the radius of the resulting bodies.

I claim:

1. The method of connecting a conducting metal part to a given conducting metallic spot of a semiconductor device, which comprises placing between the metal part and said metallic spot a solid body of plastically deformable and electrically good conducting metal of substantially spherical shape, and compressing the body between the part and the device under sufficient pressure to plastically deform and cold-weld the body to the part and the spot, whereby the part is firmly connected mechanically and electrically with the device at said spot.

2. In the method according to claim 1, the step of producing said deformable body by comminuting liquid metal by issuing it from a nozzle.

3. In the method according to claim 1, said deformable body consisting of gold.

4. The method of connecting a conducting metal part to a given conducting metallic spot of a semiconductor device, which comprises placing between the metal part and said metallic spot a solid body of plastically deformable and electrically good conducting metal of substantially spherical shape, holding said body in position on said spot, and compressing the body between the part and the device under sufficient pressure to plastically deform and cold-weld the body to the part and the spot, whereby the part is firmly connected mechanically and electrically with the device at said spot.

5. The method of connecting a conducting metal part to a given conducting metallic spot of a semiconductor device, which comprises placing between the metal part and said metallic spot a solid body of plastically deformable and electrically good conducting metal of substantially spherical shape, placing a retainer structure between the part and the device for retaining the body at said spot, and compressing the body between the part and the device under sufficient pressure to plastically deform and cold-weld the body to the part and the spot, whereby the part is firmly connected mechanically and electrically with the device at said spot.

6. The method of connecting a conducting metal part to a given conducting metallic spot of a semiconductor device, which comprises providing said device with a cavity at said metal spot, placing into said cavity a solid body of plastically deformable and electrically good conducting metal of substantially spherical shape having a diameter larger than that of said cavity, and compressing the body between the part and the device under sufficient pressure to plastically deform and cold-weld the body to the part and the spot, whereby the part is firmly connected mechanically and electrically with the device at said spot.

7. The method of joining a metal electrical connecting member with a given metal spot of a semiconductor member, which comprises providing at least one of said metal members with a cavity located at said spot in joined condition of the members, placing into said cavity a substantially spherical solid body having a larger diameter than said cavity and consisting of plastically deformable and electrically good conducting metal, and compressing the body between said two members under sufficient pressure to deform and cold-weld the body to the member and the spot, whereby the members are firmly joined together mechanically and electrically at said spot.

8. The method of forming a metal electric connection between mutually spaced metal spots of a semiconductor device, which comprises placing substantially spherical solid bodies of plastically deformable and electrically good conducting metal between said respective spots on the one hand and respective conductively interconnected points of a plate on the other hand, and compressing said bodies between said device and said plate under sufficient pressure to deform and cold-weld the bodies to the plate and the spots, whereby the device and the plate are firmly joined together electrically and mechanically at said spots.

References Cited by the Examiner

UNITED STATES PATENTS

| | | | |
|---|---|---|---|
| 1,128,175 | 2/15 | Morf. | |
| 1,744,810 | 1/30 | Shallcross. | |
| 1,936,018 | 11/33 | Hodgson | 29—501 X |
| 2,545,352 | 3/51 | Gibbs. | |
| 2,754,065 | 7/56 | Hawley. | |
| 2,888,614 | 5/59 | Barnes | 29—155.5 X |
| 2,996,800 | 8/61 | Holly | 29—494 |
| 3,006,067 | 10/61 | Anderson et al. | 29—473.1 X |
| 3,015,884 | 1/62 | Chamberlain | 29—423 |
| 3,024,299 | 3/62 | Nijhuis et al. | 29—470.1 X |
| 3,028,663 | 4/62 | Iwersen et al. | 29—470.1 X |
| 3,075,282 | 1/63 | McConville | 29—497.5 X |

JOHN F. CAMPBELL, *Primary Examiner.*

WHITMORE A. WILTZ, *Examiner.*